US007032039B2

(12) United States Patent
DeCaro

(10) Patent No.: US 7,032,039 B2
(45) Date of Patent: Apr. 18, 2006

(54) METHOD FOR IDENTIFICATION OF SPI COMPATIBLE SERIAL MEMORY DEVICES

(75) Inventor: Richard V. DeCaro, El Dorado Hills, CA (US)

(73) Assignee: Atmel Corporation, San Jose, CA (US)

( * ) Notice: Subject to any disclaimer, the term of this patent is extended or adjusted under 35 U.S.C. 154(b) by 424 days.

(21) Appl. No.: 10/284,597

(22) Filed: Oct. 30, 2002

(65) Prior Publication Data

US 2004/0085822 A1 May 6, 2004

(51) Int. Cl.
*G06F 3/00* (2006.01)

(52) U.S. Cl. .............................. 710/16; 710/8; 710/17; 365/185.4

(58) Field of Classification Search .................. 710/15, 710/16, 17, 18, 8, 9, 10, 11
See application file for complete search history.

(56) References Cited

U.S. PATENT DOCUMENTS

| | | | | |
|---|---|---|---|---|
| 4,451,903 A | 5/1984 | Jordan | 365/94 |
| 5,058,071 A * | 10/1991 | Kohda et al. | 365/185.09 |
| 5,991,194 A * | 11/1999 | Jigour et al. | 365/185.04 |
| 6,163,478 A | 12/2000 | Kasa et al. | 365/185.01 |
| 6,181,981 B1 | 1/2001 | Varga et al. | 700/236 |
| 6,223,290 B1 | 4/2001 | Larsen et al. | 713/201 |
| 2003/0110339 A1* | 6/2003 | Calvignac et al. | 710/305 |
| 2003/0163712 A1* | 8/2003 | LaMothe et al. | 713/189 |
| 2003/0177380 A1* | 9/2003 | Woods | 713/200 |
| 2003/0208656 A1 | 11/2003 | Hawkins | 711/103 |

OTHER PUBLICATIONS

Website printout, Advanced Micro Devices, AMD Introduces 16Mbit Zero-Power Flash Devices, 2002, 2 pgs.

Application Note, AP-003-CFI-E, "Common Flash Memory Interface (CFI) Specification", 14 pages.

Intel Application Note 646, "Common Flash Interface (CFI) and Command Sets", Apr. 2000, 25 pages.

* cited by examiner

*Primary Examiner*—Kim Huynh
*Assistant Examiner*—Alan S. Chen
(74) *Attorney, Agent, or Firm*—Schneck & Schneck; Thomas Schneck; Nissa M. Strottman

(57) ABSTRACT

A method for identifying Serial Peripheral Interface (SPI) compatible serial interface memory devices. A microprocessor sends a single command requesting identification information to an SPI device installed on the SPI bus. A byte string, including the JEDEC manufacturer ID, device ID, and any extended device information, is sent back to the microprocessor. The byte string may include one or more continuation codes when the manufacturer ID exceeds 1 byte. The byte string also includes one byte indicating how many bytes of extended device information should be read by the microprocessor. The identification process, issuing the command and receiving the reply, is completed in one operation.

15 Claims, 2 Drawing Sheets

METHOD FOR IDENTIFICATION OF SPI COMPATIBLE SERIAL MEMORY DEVICES

FIELD OF THE INVENTION

This invention relates to the identification of memory devices, particularly serial interface memory devices.

BACKGROUND OF THE INVENTION

Non-volatile memory devices are arranged in either a parallel interface arrangement or a serial interface arrangement. In past years, the parallel interface was more prevalent because of its fast, random access capability, making it ideal for direct code execution. In recent years, the serial interface has become more prevalent for storing personal preference and configuration data, offering a low pin count, low power consumption, and smaller packages. The parallel interface uses independent outputs and address pins with a rectangular array of memory devices. The serial interface typically uses a two wire configuration and sometimes a third wire for clock signals. Other wire arrangements can be found but a clock signal is always present.

An example of a parallel interface is shown in U.S. Pat. No. 4,451,903 entitled "Method for Encoding Product and Programming Information in Semiconductors," assigned to the assignee of the present invention. FIG. 4 of the '903 patent shows how many parameters that characterize non-volatile memory devices may be specified for encoding in the memory. In this example, 15 different parameters, including device manufacturer are encoded.

The increasing popularity of the serial interface has led to the development of the Serial Peripheral Interface (SPI) protocol. The SPI standardizes the pins for serial interface devices and defines a group of such pins as an SPI bus.

Despite the growing number of serial interface memory manufacturers (each of whom has been assigned a manufacturer identification by JEDEC publication 106, which standardized manufacturer identification codes encoded on devices), there is no common electronic method for identifying these serial interface memories, or SPI devices, on an SPI bus once these devices are installed. This is problematic since different devices possess different characteristics, such as voltage range, erase times, etc. and may possess different architectures and command sets. If multiple, different SPI devices are installed on an SPI bus, it is necessary to identify these different devices in order for them to operate within the system.

While there are common methods for identifying parallel non-volatile memory devices, such as those contained in the Common Flash Memory Interface (CFI) specification which uses a single, common command to identify different suppliers' devices, these methods cannot be employed in serial devices because serial devices lack the address and data lines which allow the random access of information in parallel devices. (See "Common Flash Memory Interface (CFI) Specification," Sharp AP-003-CFI-E.) In contrast to parallel devices which may have 16 or more address lines and between 8 and 32 data lines and, as noted above, access data randomly, serial devices have three lines and access information sequentially. Clearly, it would be desirable for there to be a method which not only identified any and all SPI devices installed on a system's SPI bus by the device's manufacturer and vendor-specific information, such as device density, device family, and device version, but also identified extended device information such as process technology, die revision, voltage levels, etc.

SUMMARY OF THE INVENTION

The present invention provides a command and reply serial communication method for obtaining information about an installed SPI memory device. A single command requesting information is sent to an SPI device which replies with a byte string of variable length including the manufacturer of the device, the device identification, and any extended device information, such as process technology, die revision, voltage levels, sector sizes, page sizes, erase times, etc. The reply indicates the JEDEC Manufacturer ID (based on JEDEC publication 106) and may include one or more continuation codes (in compliance with JEDEC publication 106) where the JEDEC Manufacturer ID cannot be indicated by one byte. The device is identified in two bytes in a vendor specific format indicating information such as device density, device family, and device version. In addition, the reply includes one byte which indicates the length of an extended device information string; this defines the relevant number of bytes which must be read to obtain additional information about the SPI device and prevents an associated microprocessor from reading unnecessary data.

DETAILED DESCRIPTION

Figure 1:
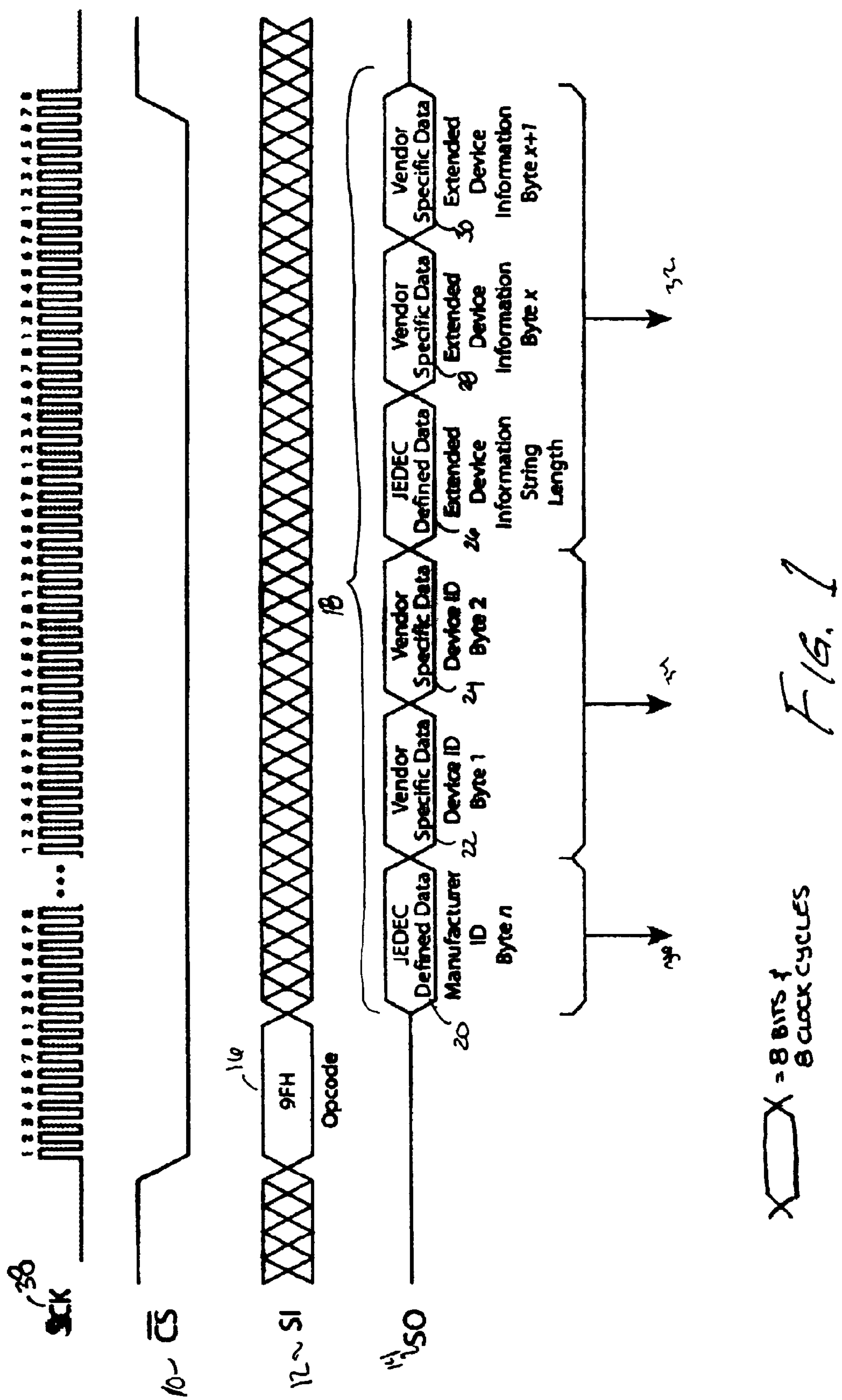
FIG. 1 is a timing diagram of a command and reply serial communications sequence in accordance with the invention, with time running in the horizontal direction and data packet amplitude in the vertical direction.
Figure 2:
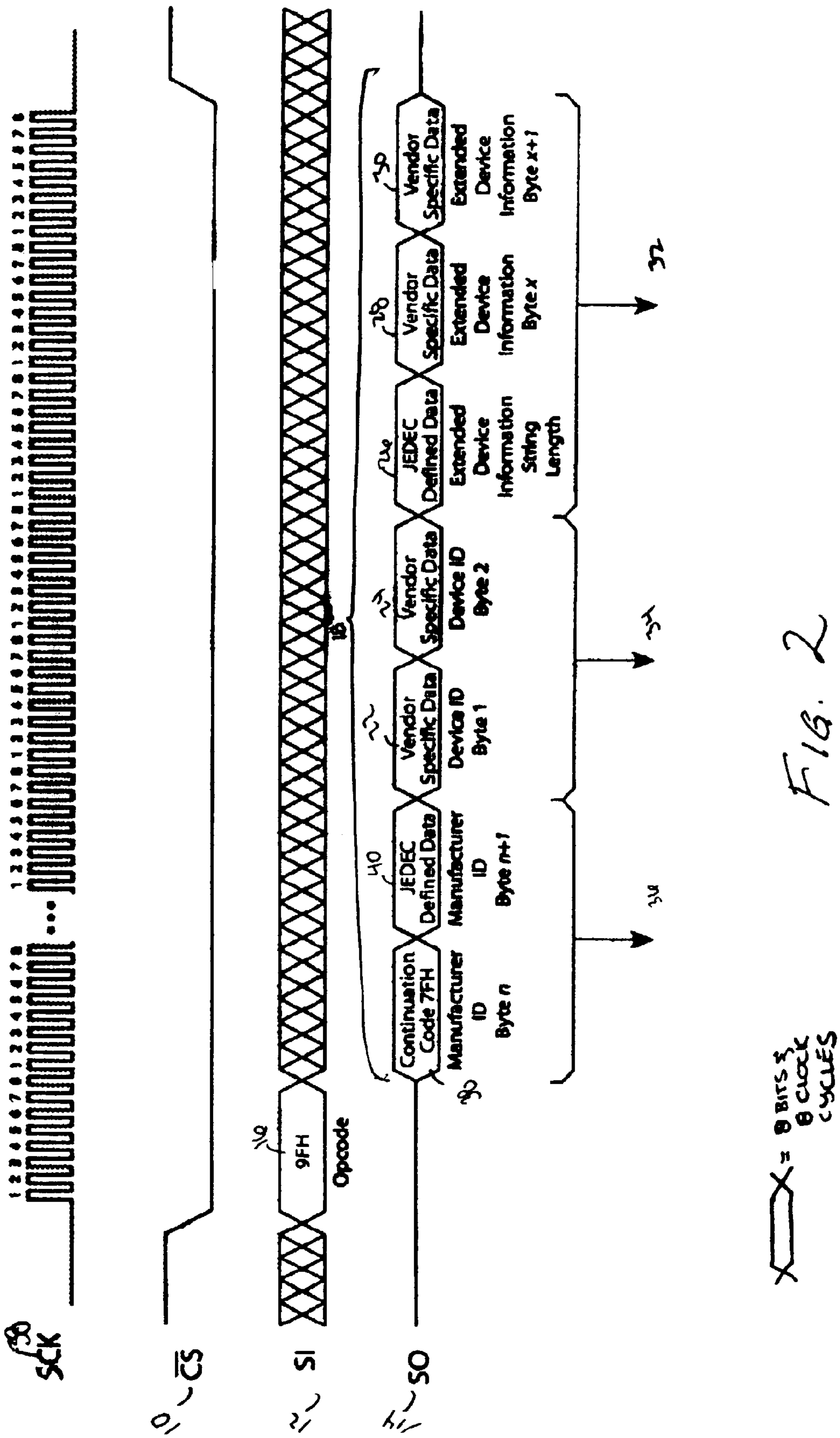
FIG. 2 is a timing diagram of a command and reply communication protocol that is an alternate embodiment of the protocol shown in FIG. 1.

All devices discussed in the various embodiments of the invention are serial non-volatile ("NV") memory devices compatible with the Serial Peripheral Interface (SPI) protocol and connected to an associated microprocessor. As shown in FIG. 1, a serial NV memory device has at least three lines: the chip select signal (CS) 10; serial in (SI) 12; and serial out (SO) 14. A clock signal (SCK) 38 is also shown. Each transition shown in FIGS. 1 and 2 represents 8 bits and 8 clock cycles.

Referring to FIG. 1, in order to identify a serial NV memory device, a microprocessor sends a command 16 in the form of encoded pulses in a data packet to the device requesting information to identify the device, its manufacturer, and provide any extended device information such as process technology, die revision, voltage levels, sector size, page size, erase times, etc. This command 16, in one embodiment an 8-bit opcode 1001 1111 (9FH), is clocked into the device. The opcode 16 must be dedicated, i.e., it cannot share functionality with other opcodes.

In response to the opcode 16, a reply 18, a data packet comprising a byte string of variable length, is clocked out. In one embodiment, the first byte, byte n, 20 of the reply 18 gives the JEDEC Manufacturer ID 36 specified in JEDEC publication 106. The next two bytes 22, 24 of the reply represent device ID data 34. These two bytes 22, 24 are vendor specific data used to specify information such as device density, device family, and device version. The fourth byte 26 indicates the length of the extended device information string 32; in other words, it tells the microprocessor how many additional bytes it has to read to obtain all available information about the device. For instance, using hexadecimal notation, 00H indicates 0 additional bytes of extended information, 01H indicates 1 additional byte, 0FH indicates 15 additional bytes, 10H indicates 16 additional bytes, etc. Up to 254 (FFH is reserved for future expansion) information bytes may be specified. In this embodiment, 2 extended device information bytes, byte x 28 and byte x+1 30, are presented. As noted above, the extended device information bytes 32 are vendor-specific bytes used to define detailed device information such as process, die revision, voltage range, sector size, page size, erase times, etc.

JEDEC Publication 106 also provides for continuation codes (7FH) where a JEDEC-assigned manufacturer cannot be identified in 1 byte. (JEDEC Publication 106 requires that the manufacturer ID byte contain seven data bits and one parity bit. Since identification codes have been assigned to more than 128 manufacturers (whose identification codes could be represented by seven data bits), continuation codes are used to indicate a manufacturer registered in subsequent "banks" of manufacturers (i.e., bank two lists manufacturers 129–256, bank three lists manufacturers 257–384, etc.) Multiple continuation codes may be used to indicate which bank contains a manufacturer's ID. For instance, no continuation code indicates a manufacturer's ID in the first bank, one continuation code indicates a manufacturer's ID in the second bank, two continuation codes indicates a manufacturer's ID in the third bank, etc.) When it encounters the continuation code, 7FH, the microprocessor should continue to read bytes indicating the manufacturer ID. The first non-7FH byte signifies the last byte of manufacturer ID data.

As shown in FIG. 2, the reply 18 from the device from the identification command 16 may include a continuation code 38 along with the manufacturer ID data 36. Here, the continuation code 7FH 38 represents byte n while the JEDEC manufacturer ID 40 represents byte n+1. The reply 18 still contains device ID data 34 and the extended device information string 32 as described above in FIG. 1. (In other embodiments, more than one continuation code may be present.)

As shown above in FIGS. 1 and 2, all available information about a device may be obtained in one operation. This identification method does not require any memory address data to be sent to a device and therefore can be used to identify any device without alteration for any device density (1-Mbit, 64-Mbit, 256-Mbit, etc.). In other words, no dummy bytes need to be sent to the device in order to identify the device.

The invention claimed is:

1. A method for identifying a serial peripheral interface compatible serial interface memory device comprising:

a) sending a clocked command to the device, the command requesting manufacturer and device information; and b) receiving a clocked reply from the device, the reply identifying:

i) the manufacturer of the device;

ii) device data;

iii) a length of an extended information string, wherein the string contains vendor specific information about the device, the length indicating a number of bytes to be read to obtain information in the extended information string; and iv) extended vendor specific information about the device, if any, wherein identifying the device is completed in one operation.

2. The method of claim 1 wherein the reply identifies the device using a vendor specific format.

3. The method of claim 1 wherein the reply identifies a JEDEC manufacturer identification.

4. The method of claim 3 further comprising the reply providing at least one continuation code for identifying a JEDEC manufacturer identification.

5. The method of claim 1 wherein the reply identifies the manufacturer of the device in "n" bytes.

6. The method of claim 1 wherein the reply identifies the device data in two bytes.

7. A method for identifying a serial peripheral interface compatible serial interface memory device comprising:

a) requesting manufacturer and device information from the device using a single clocked command; and b) receiving a clocked byte string of variable length including the requested information and any extended vendor specific information from the device, wherein the clocked byte string identifies a length of an extended information string identifying vendor specific information about the device, the length indicating a number of bytes to be read to obtain information in the extended information string, wherein requesting and receiving the information is completed in one operation.

8. The method of claim 7 wherein receiving the requested information further comprises reading the requested information.

9. The method of claim 7 wherein the byte string identifies the manufacturer of the device.

10. The method of claim 7 wherein the byte string identifies device data.

11. The method of claim 10 further comprising identifying device data with a vendor specific format.

12. The method of claim 9 further comprising identifying the manufacturer of the device with a JEDEC manufacturer identification.

13. The method of claim 12 further comprising using at least one continuation code for providing a JEDEC manufacturer identification.

14. The method of claim 7 wherein the byte string identifies the manufacturer of the device in "n" bytes.

15. The method of claim 7 wherein the byte string identifies the device data in two bytes.

* * * * *